United States Patent
Kobayashi et al.

(10) Patent No.: US 10,566,558 B2
(45) Date of Patent: Feb. 18, 2020

(54) PHOTODETECTION ELEMENT AND PHOTODETECTOR

(71) Applicant: Kabushiki Kaisha Toshiba, Minato-ku (JP)

(72) Inventors: Mitsuyoshi Kobayashi, Ota (JP); Satomi Taguchi, Ota (JP); Isao Takasu, Setagaya (JP); Rei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/691,973

(22) Filed: Aug. 31, 2017

(65) Prior Publication Data

US 2018/0269415 A1    Sep. 20, 2018

(30) Foreign Application Priority Data

Mar. 17, 2017 (JP) ................. 2017-052228

(51) Int. Cl.
*H01L 29/08* (2006.01)
*H01L 51/42* (2006.01)
*H01L 27/30* (2006.01)

(52) U.S. Cl.
CPC ........ *H01L 51/4253* (2013.01); *H01L 27/305* (2013.01)

(58) Field of Classification Search
CPC .................. H01L 51/4253; H01L 27/305
USPC ........................................ 257/40
See application file for complete search history.

(56) References Cited

U.S. PATENT DOCUMENTS

| | | | |
|---|---|---|---|
| 8,384,034 B2 | 2/2013 | Nakamura | |
| 8,759,781 B2 | 6/2014 | Lee et al. | |
| 9,203,052 B2* | 12/2015 | Lee ...................... | H01L 51/5262 |
| 9,459,356 B2 | 10/2016 | Lee et al. | |
| 2013/0285040 A1* | 10/2013 | Cabanillas Gonzalez ................... | |
| | | | H01L 27/305 |
| | | | 257/40 |
| 2016/0133766 A1* | 5/2016 | Lee ...................... | H01L 31/0326 |
| | | | 136/255 |
| 2018/0277607 A1 | 9/2018 | Takasu et al. | |

FOREIGN PATENT DOCUMENTS

| | | |
|---|---|---|
| JP | 1989-008677 A | 1/1989 |
| JP | 2006-266936 A | 10/2006 |
| JP | 2010-206067 | 9/2010 |
| JP | 4600947 | 12/2010 |
| JP | 2013-149729 | 8/2013 |
| JP | 2014-502055 A | 1/2014 |
| JP | 2014-527557 A | 10/2014 |
| JP | 2016-148666 | 8/2016 |
| JP | 2016-178204 | 10/2016 |
| JP | 2018-157170 A | 10/2018 |

* cited by examiner

*Primary Examiner* — Caleb E Henry
(74) *Attorney, Agent, or Firm* — Oblon, McClelland, Maier & Neustadt, L.L.P.

(57) ABSTRACT

According to an embodiment, a photodetection element includes a photoelectric conversion layer having a density increasing from one end side to another end side in a thickness direction and a uniform composition in the thickness direction to convert energy of radiation into charges.

12 Claims, 9 Drawing Sheets

PHOTODETECTION ELEMENT AND PHOTODETECTOR

CROSS-REFERENCE TO RELATED APPLICATIONS

This application is based upon and claims the benefit of priority from Japanese Patent Application No. 2017-052228, filed on Mar. 17, 2017; the entire contents of which are incorporated herein by reference.

FIELD

Embodiments described herein relate generally to a photodetection element and a photodetector.

BACKGROUND

Photodetectors have been known that detect charges converted by photoelectric conversion layers. As an example of such photodetectors, a photodetector has been known that includes a photoelectric conversion layer that is disposed between a pair of electrode layers and detects, via the electrodes, charges converted by the photoelectric conversion layer.

Radiation incident on the photoelectric conversion layer scatters backward sometimes. The backscattering causes deterioration of radiation detection accuracy sometimes. For reducing the deterioration, a structure is disclosed in which an absorption scintillator made of an organic material and a backscattering scintillator made of an inorganic material having a high backscattering rate are layered. In the conventional technique, however, a read circuit for each layer of scintillator needs to be provided. It is, thus, difficult for the conventional technique to easily increase the radiation detection accuracy.

DETAILED DESCRIPTION

According to an embodiment, a photodetection element includes a photoelectric conversion layer having a density increasing from one end side to another end side in a thickness direction and a uniform composition in the thickness direction to convert energy of radiation into charges.

The following describes an embodiment in detail with reference to the accompanying drawings.

Figure 1:
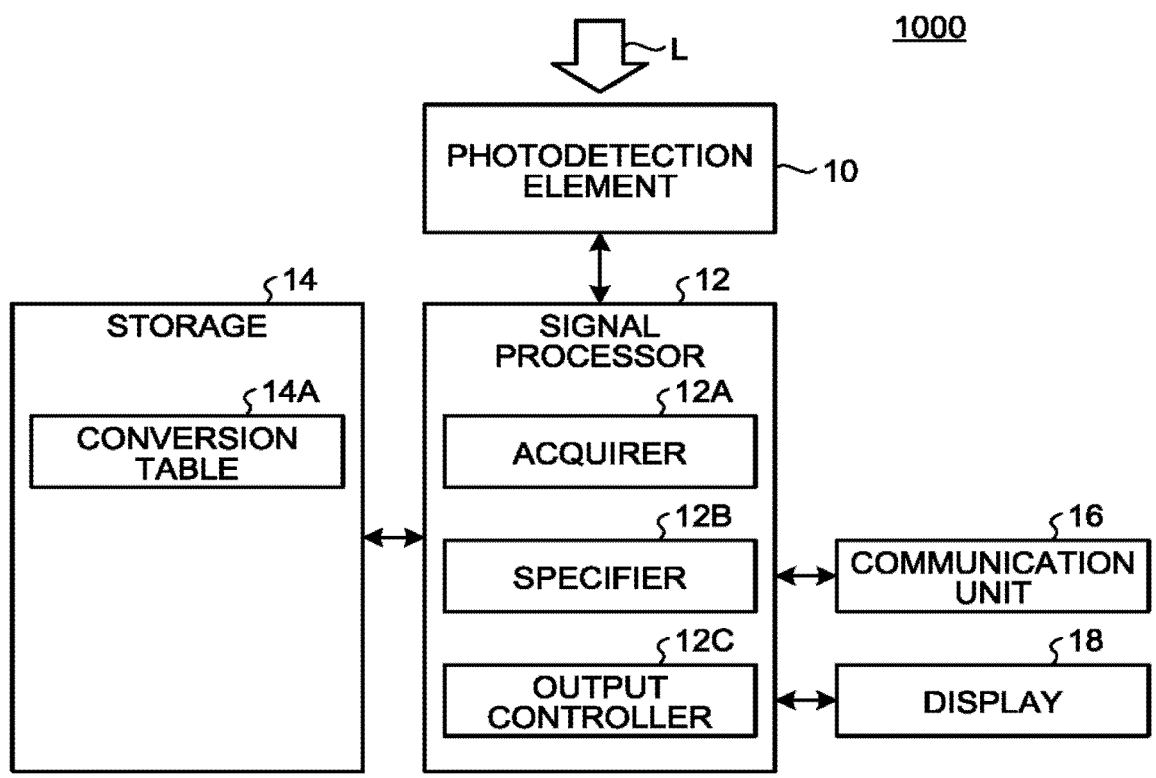
FIG. 1 is a schematic diagram of a photodetector.

FIG. 1 is a schematic diagram illustrating an example of a photodetector 1000.

The photodetector 1000 includes a photodetection element 10, a signal processor 12, a storage 14, a communication unit 16, and a display 18. The signal processor 12, and the photodetection element 10, the storage 14, the communication unit 16 and the display 18 are connected with one another such that they can exchange data and signals.

The photodetection element 10 outputs an output signal according to radiation L incident thereon. The signal processor 12 identifies detected energy of the radiation L incident on the photodetection element 10 using the output signal acquired from the photodetection element 10.

The storage 14 stores therein various types of data. The communication unit 16 communicates with an external device via a network, for example. In the embodiment, the communication unit 16 transmits information indicating a result identified by the signal processor 12 to the external device. The display 18 displays various images. In the embodiment, the display 18 displays the information indicating the result identified by the signal processor 12.

The photodetector 1000 may include any one of the display 18 and the communication unit 16. The respective units included in the photodetector 1000 may be housed in a single housing or divided so as to be arranged in a plurality of housings.

Photodetection Element 10

The following describes the photodetection element 10.

Figure 2:
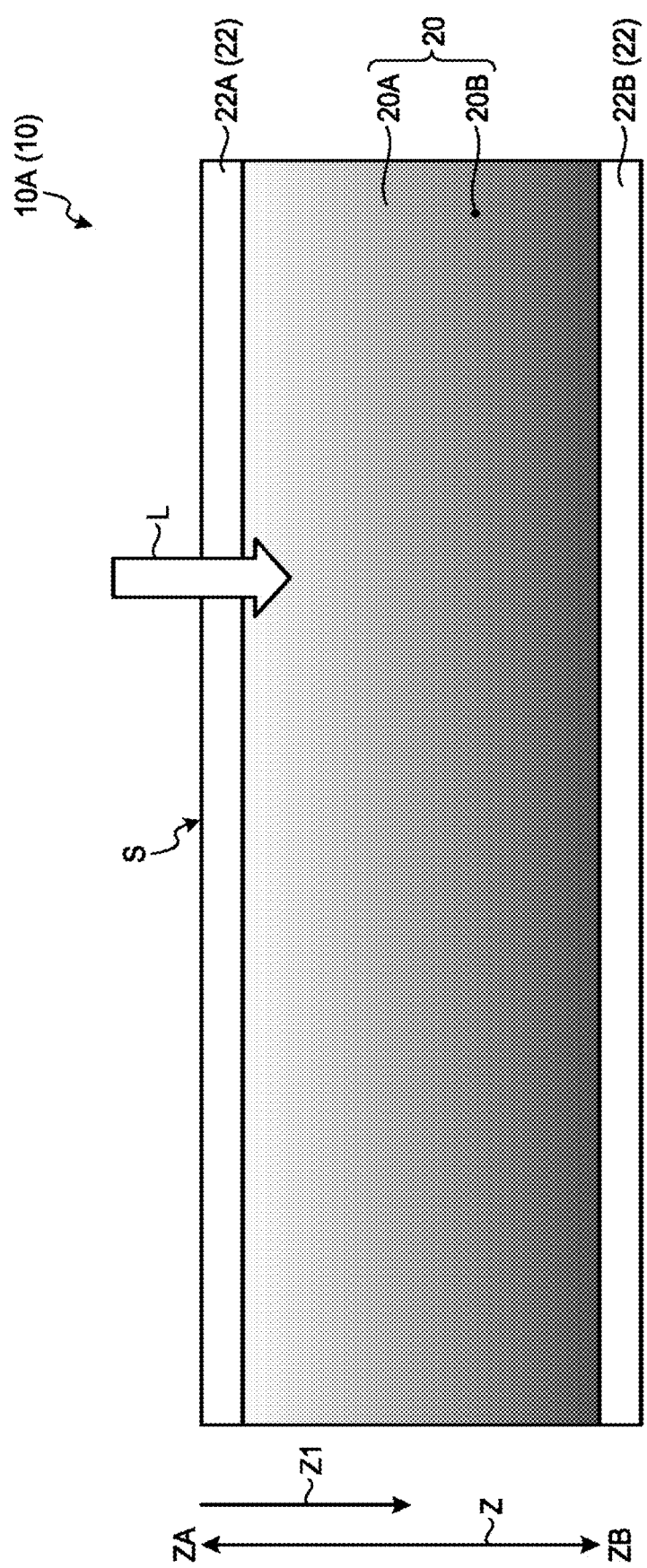
FIG. 2 is a schematic diagram of a photodetection element.

FIG. 2 is a schematic diagram illustrating a photodetection element 10A. The photodetection element 10A is an example of the photodetection element 10.

Photodetection Element 10A

The photodetection element 10A includes a photoelectric conversion layer 20, an electrode 22A, and an electrode 22B. In the embodiment, the photoelectric conversion layer 20 is disposed between the electrodes 22A and 22B.

The following describes an electrode 22. The electrode 22 collectively represents the electrodes 22A and 22B. At least one of the electrodes 22A and 22B is disposed in contact with the photoelectric conversion layer 20.

The electrode 22 is made of a material having conductivity. The electrode 22 is made of a material such as indium tin oxide (ITO), graphene, zinc oxide (ZnO), aluminum, or gold. The thickness of the electrode 22 is not limited to any specific thickness. The thickness of the electrode 22 is 35 nm, for example.

The following describes the photoelectric conversion layer 20.

The photoelectric conversion layer 20 converts energy of the radiation L into charges.

In the embodiment, the photoelectric conversion layer 20 has a density increasing from one end side to the other end side in a thickness direction (the arrow Z direction, hereinafter, described as the thickness direction Z) and converts energy of radiation into charges. The photoelectric conversion layer 20 has a density increasing from the one end side ZA to the other end side ZB in the thickness direction Z, and has a uniform composition in the thickness direction Z.

The thickness direction Z is the thickness direction of the photoelectric conversion layer 20 formed in layers. In the embodiment, the thickness direction Z coincides with the incident direction of the radiation L to the photodetection element 10A. In the embodiment, the one end side ZA in the thickness direction Z of the photoelectric conversion layer 20 is an up side in the incident direction of the radiation L.

The density of the photoelectric conversion layer 20 represents a weight per unit volume of the photoelectric conversion layer 20.

In the embodiment, the photoelectric conversion layer 20 has a density increasing in a step-by-step manner or continuously from the one end side ZA to the other end side ZB in the thickness direction Z.

The one end side ZA, at which the density is the lowest, in the thickness direction Z of the photoelectric conversion layer 20 is the up side in the incident direction of the radiation L. The other end side ZB, at which the density is the highest, in the thickness direction Z of the photoelectric conversion layer 20 is a down side in the incident direction of the radiation L. The photoelectric conversion layer 20, thus, has a density increasing in a step-by-step manner or continuously from the up side to the down side in the incident direction of the radiation L (refer to the arrow Z1 direction).

The photoelectric conversion layer 20 has a uniform composition in the thickness direction Z. In other words, the photoelectric conversion layer 20 has the same composition in the thickness direction Z.

The fact that the composition is uniform means that contained components are the same. The fact that the contained components are the same (uniform) specifically means that the components excluding the components contained in total at a rate equal to or smaller than 30 weight percent are the same. In other words, the fact that the contained components are the same (uniform) means that the components contained in total at a rate equal to or smaller than 70 weight percent are the same.

The photoelectric conversion layer 20 has a uniform composition in the thickness direction Z and may have a different composition ratio in the thickness direction Z. The photoelectric conversion layer 20 has the same contained components in the thickness direction Z and may have a different ratio (weight ratio) among the contained components in the thickness direction Z.

The material used for the photoelectric conversion layer 20 is not limited to any specific constituent material. Any material satisfying the conditions described above may be used. For example, the photoelectric conversion layer 20 includes, as a principal component, an inorganic material such as amorphous silicon or an organic material. The principal component means that the content rate of the component is equal to or larger than 70%.

The photoelectric conversion layer 20 may have wavelength selectivity. The photoelectric conversion layer 20 having the wavelength selectivity allows light having a wavelength outside a wavelength region serving as a photoelectric conversion target to pass through the photoelectric conversion layer 20. The photoelectric conversion layer 20 may have a different wavelength selectivity in the thickness direction Z. In this case, the photoelectric conversion layer 20 may contain quinacridone or subphthalocyanine, for example.

The principal component of the photoelectric conversion layer 20 is preferably an organic material from points of views such as cost reduction of raw material, flexibility, ease of forming, high absorption coefficient, weight reduction, and shock resistance.

The use of the photoelectric conversion layer 20 containing an organic material as the principal component makes it possible to further increase a resistivity of the photoelectric conversion layer 20 compared to the photoelectric conversion layer 20 containing no organic material as the principal component. As the resistivity of the photoelectric conversion layer 20 is increased, the charges produced in the photoelectric conversion layer 20 can be prevented from spreading to regions corresponding to other pixel regions in the photoelectric conversion layer 20. In other words, the respective pixel regions can be prevented from being mixed with charges from the other pixel regions.

The region corresponding to the pixel region in the photoelectric conversion layer 20 is preliminarily determined by adjusting the arrangement of the electrode 22 (the electrodes 22A and 22B), for example.

In the embodiment, the photoelectric conversion layer 20 contains a photoelectric conversion material 20A and an additive material 20B.

The photoelectric conversion material 20A has a photoelectric conversion function that converts energy of the radiation L into charges.

The photoelectric conversion material 20A is an organic material, for example. Specifically, the photoelectric conversion material 20A is selected at least from one of a polyphenylene vinylene (PPV) derivative and a polythiophene polymer material.

The polyphenylene vinylene derivative is poly[2-methoxy-5-(2'-ethylhexyloxy)-p-phenylene vinylene] (MEH-PPV), for example. The polythiophene polymer material is poly(3-alkylthiophene) such as poly(3-hexylthiophene) (P3HT) or poly[(9,9-dialkylfluorene-2,7-diyl)-co-(bithiophene)](F8T2), for example.

Particularly preferably, P3HT or F8T2 is used for the photoelectric conversion material 20A.

The photoelectric conversion material 20A may be a mixture of an organic material and an inorganic material. In this case, the photoelectric conversion material 20A may be a mixture of the organic material described above and fullerene, fullerene derivatives, carbon nanotubes (CNTs) having semiconductivity, or CNT compounds, for example.

Examples of fullerene derivatives include [6,6]-phenyl-C61-butyric acid methyl ester (PCBM), fullerene dimmers, and alkali metal or alkali earth metal doped fullerene compounds. The CNT is carbon nanotube including fullerene or metal doped fullerene, for example. The CNT is a CNT compound including various molecules added to side walls or the tip of CNT, for example.

In this case, a mixture of PCBM and P3HT with a weight ratio ranging from 10:1 to 1:10, a mixture of PCBM and F8T2 with a weight ratio ranging from 10:1 to 1:10, or PTB7 may be used for the photoelectric conversion material 20A.

The additive material 20B has a function that supplies energy of the radiation L to the photoelectric conversion material 20A. In the embodiment, the additive material 20B is added to the photoelectric conversion material 20A. The weight per unit volume (density) of the additive material 20B is preferably larger than that of the photoelectric conversion material 20A.

The shape of the additive material 20B is not limited to any specific shape. For example, when the additive material 20B is a solid, the additive material 20B is preferably formed in particles. The shape of the particles of the additive material 20B is not limited to any specific shape.

When the additive material 20B is formed in particles, an average particle diameter of the additive material 20B is preferably equal to or larger than 1 nm and equal to or smaller than 100 nm, particularly preferably, equal to or larger than 1 nm and equal to or smaller than 20 nm. The additive material 20B is preferably formed in particles in a nano size (nano particles).

The average particle diameter of the additive material 20B can be measured by a laser particle size distribution meter, for example.

The constituent material of the additive material 20B is not limited to any specific constituent material. Any material satisfying conditions described above can be used. Examples of the constituent material of the additive material 20B include inorganic materials such as ZnO, ZnS, ZnSe, PbS, and $Bi_2O_3$, and scintillation materials such as gadolinium oxy sulfide (GOS), gadolinium aluminum gallium garnet (GAGG), lutetium yttrium oxyorthosilicate (LYSO), germanium oxyorthosilicate (GSO), yttrium aluminum perovskit (YAP), lutetium aluminum garnet (LuAG), and lead tungstate (PWO).

One kind or a plurality of kinds of the additive materials 20B may be contained in the photoelectric conversion layer 20. When the additive material 20B is formed in particles, the particle may be made of one kind of material or may be a complex particle made of a plurality of kinds of materials.

The particle diameters of the additive material 20B contained in the photoelectric conversion layer 20 may substantially be the same (a difference in particle diameters is in a range of ±20%). The additive material 20B may be a mixture of particles having different diameters and different kinds of materials.

The additive material 20B is added to the photoelectric conversion material 20A. In the embodiment, a weight ratio (contained amount) of the additive material 20B to the photoelectric conversion material 20A is adjusted. Specifically, the adjustment is done such that the contained amount of the additive material 20B in the photoelectric conversion layer 20 differs in the thickness direction Z. More specifically, the adjustment is done such that the contained amount of the additive material 20B in the photoelectric conversion material 20A is increased from the one end side ZA (the up side in the incident direction of the radiation L) to the other end side ZB (the down side in the incident direction of the radiation L) in the thickness direction Z. As a result of the adjustment, the density of the photoelectric conversion layer 20 satisfies the condition described above.

In the embodiment, the contained amount of the additive material 20B in the photoelectric conversion material 20A in the photoelectric conversion layer 20 differs in the thickness direction Z. The photoelectric conversion layer 20, thus, has a different density in the thickness direction Z. The contained amount of the additive material 20B in the photoelectric conversion material 20A is increased from the one end side ZA to the other end side ZB in the thickness direction Z. The density of the photoelectric conversion layer 20 is, thus, increased from the one end side ZA to the other end side ZB in the thickness direction Z.

The photoelectric conversion layer 20 has a uniform composition in the thickness direction Z. In the embodiment, the photoelectric conversion layer 20 has the same composition in the thickness direction Z and only the contained amount (weight ratio) of the additive material 20B differs in the thickness direction Z. This structure achieves the photoelectric conversion layer 20 that has a density increasing from the one end side ZA to the other end side ZB in the thickness direction Z, and a uniform composition in the thickness direction Z.

Known methods may be used for adjusting the density of the photoelectric conversion layer 20 to have the density structure described above. For example, the density of the photoelectric conversion layer 20 can be adjusted by adjusting a viscosity of the photoelectric conversion material 20A, an amount of the additive material 20B added to the photoelectric conversion material 20A, and a dispersion degree of the additive material 20B in the photoelectric conversion material 20A. The dispersion degree of the additive material 20B in the photoelectric conversion material 20A can be adjusted by adjusting a drying time in manufacturing the photoelectric conversion layer 20, for example. When the additive material 20B having conductivity or electrical static charges is used, the location or a change in contained amount of the additive material 20B in the photoelectric conversion layer 20 may be adjusted using electrophoresis.

The density is measured using an X-ray reflection method.

The type of the radiation L photoelectrically converted by the photoelectric conversion layer 20 is not limited to any specific type. The type of the radiation L photoelectrically converted by the photoelectric conversion layer 20 is at least one of beta rays, heavy particle beams, and gamma rays, for example. In the embodiment, the photoelectric conversion layer 20 particularly preferably photoelectrically converts beta rays.

The type of the radiation L photoelectrically converted by the photoelectric conversion layer 20 is adjustable by changing the constituent materials and the thickness of the photoelectric conversion layer 20, for example.

For example, when the type of the radiation L photoelectrically converted by the photoelectric conversion layer 20 is beta rays or heavy particle beams, P3HT is preferably used for the photoelectric conversion material 20A contained in the photoelectric conversion layer 20 while any of ZnO, ZnS, ZnSe, PbS, $Bi_2O_3$, GAGG, LYSO, LuAG, and GOS is preferably used for the additive material 20B.

When the type of the radiation L photoelectrically converted by the photoelectric conversion layer 20 is beta rays or heavy particle beams, the thickness of the photoelectric conversion layer 20 is preferably equal to or larger than 1 μm and equal to or smaller than 1 mm.

For example, when the type of the radiation L photoelectrically converted by the photoelectric conversion layer 20 is gamma rays, P3HT is preferably used for the photoelectric conversion material 20A contained in the photoelectric conversion layer 20 while any of ZnO, ZnS, ZnSe, PbS, $Bi_2O_3$, GAGG, LuAG, and GOS is preferably used for the additive material 20B.

Photodetection Element 10B

The structure of the photodetection element 10 is not limited to the photodetection element 10A illustrated in FIG. 2. For example, the photoelectric conversion layer 20 may be a layered structure composed of a plurality of photoelectric conversion films.

Figure 3:
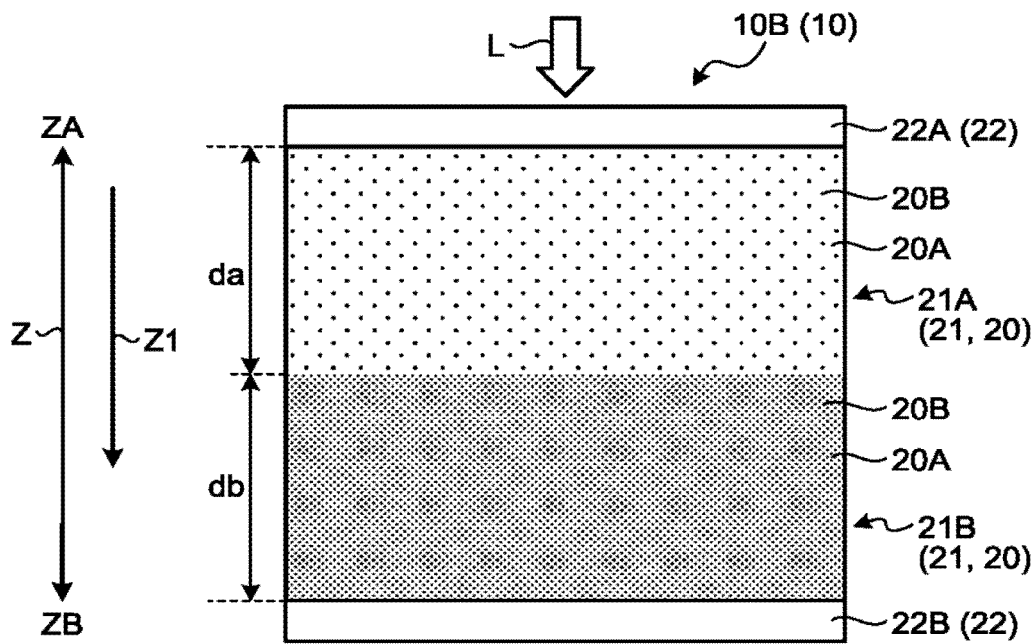
FIG. 3 is a schematic diagram of another photodetection element.

FIG. 3 is a schematic diagram illustrating an example of a photodetection element 10B. The photodetection element 10B is an example of the photodetection element 10.

The photodetection element 10B includes the electrode 22A, the photoelectric conversion layer 20, and the electrode 22B. The photoelectric conversion layer 20 included in the photodetection element 10B is a layered structure composed of a plurality of photoelectric conversion films 21.

The same constituent materials as the photoelectric conversion layer 20 are used for the photoelectric conversion films 21. The multiple photoelectric conversion films 21 included in the photoelectric conversion layer 20 each have the same composition. The multiple photoelectric conversion films 21 included in the photoelectric conversion layer 20 have different densities from one another. The density of each photoelectric conversion film 21 is the weight per unit volume of the photoelectric conversion film 21.

The multiple photoelectric conversion films 21 included in the photoelectric conversion layer 20 are arranged such that the density is increased from the one end side ZA to the other end side ZB in the thickness direction Z of the photoelectric conversion layer 20. Specifically, the photoelectric conversion film 21 having the lowest density among the photoelectric conversion layers 20 included in the photoelectric conversion layer 20 is disposed at the end on the most up side in the incident direction of the radiation L (the arrow Z1 direction). The photoelectric conversion film 21 having the highest density among the photoelectric conversion layers 20 included in the photoelectric conversion layer 20 is disposed at the end on the most down side in the incident direction of the radiation L (the arrow Z1 direction). The photoelectric conversion layer 20 has a density increasing in a step by step manner or continuously from the photoelectric conversion film 21 disposed at the end on the most up side to the photoelectric conversion film 21 disposed at the end on the most down side.

For example, a change in density in the thickness direction Z is uniform in the photoelectric conversion film 21. The photoelectric conversion layer 20 is structured by layering the multiple photoelectric conversion films 21 having different densities from one another such that the structure described above is achieved. In this case, the photoelectric conversion layer 20 has a density increasing in a step by step manner or continuously from the one end side ZA (the most up side in the incident direction of the radiation L) in the thickness direction Z to the other end side ZB (the most down side in the incident direction of the radiation L) in the thickness direction Z by layering the photoelectric conversion films 21 having the same composition and different densities from one another.

A ratio of the density of the photoelectric conversion film 21B, the density being the highest among those of the photoelectric conversion films 21, to the density of the photoelectric conversion film 21A, the density being the lowest among those of the photoelectric conversion films 21, is preferably equal to or larger than 1.1 and equal to or smaller than 5, more preferably equal to or larger than 1.1 and equal to or smaller than 3.5, and particularly preferably equal to or larger than 1.5 and equal to or smaller than 2.5.

FIG. 3 illustrates an example where the photoelectric conversion layer 20 is a layered structure composed of two photoelectric conversion films 21 (the photoelectric conversion films 21A and 21B).

In the example, the density of the photoelectric conversion film 21A is lower than that of the photoelectric conversion film 21B. The thicknesses of the photoelectric conversion films 21A and 21B may be the same or differ from each other.

Photodetection Element 10C

FIG. 3 illustrates an example where the thicknesses of the photoelectric conversion films 21A and 21B are the same. Specifically, FIG. 3 illustrates an example where a thickness da of the photoelectric conversion film 21A and a thickness db of the photoelectric conversion film 21B are the same.

Figure 4:
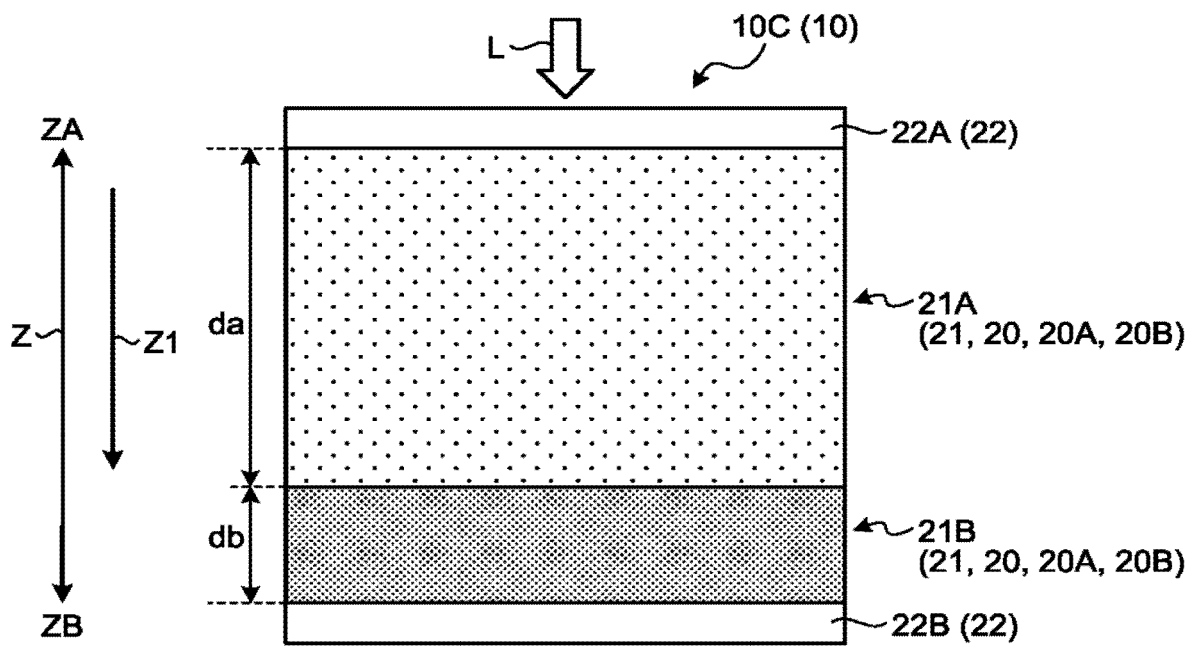
FIG. 4 is a schematic diagram of another photodetection element.

The thicknesses of the photoelectric conversion films 21A and 21B, however, may differ from each other. FIG. 4 is a schematic diagram illustrating an example of a photodetection element 10C. The photodetection element 10C is an example of the photodetection element 10.

The photodetection element 10C illustrated in FIG. 4 is a schematic diagram illustrating an example where the thicknesses of at least a part of the multiple photoelectric conversion films 21 included in the photoelectric conversion layer 20 differ from each other. As illustrated in the photodetection element 10C, the thickness da of the photoelectric conversion film 21A and the thickness db of the photoelectric conversion film 21B may differ from each other. In this case, the density of the photoelectric conversion film 21A is lower than that of the photoelectric conversion film 21B, and the photoelectric conversion films 21A and 21B have the same composition.

FIG. 4 illustrates an example where the thickness da of the photoelectric conversion film 21A is larger than the thickness db of the photoelectric conversion film 21B. The thickness da of the photoelectric conversion film 21A may be smaller than the thickness db of the photoelectric conversion film 21B.

Photodetection Element 10D

The number of photoelectric conversion films 21 included in the photoelectric conversion layer 20 is not limited to two. For example, the photoelectric conversion layer 20 may be a layered structure composed of three or more photoelectric conversion films 21.

Figure 5:
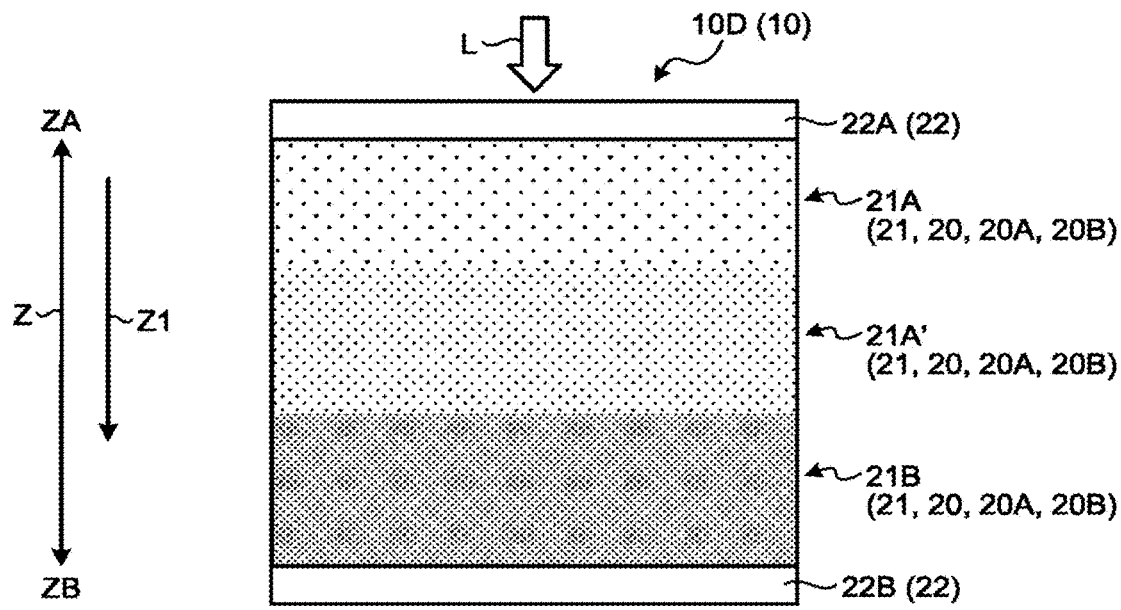
FIG. 5 is a schematic diagram of another photodetection element.

FIG. 5 is a schematic diagram illustrating an example of a photodetection element 10D. The photodetection element 10D is an example of the photodetection element 10. As illustrated in FIG. 5, the photoelectric conversion layer 20 may be a layered structure composed of three photoelectric conversion films 21 (the photoelectric conversion film 21A, a photoelectric conversion film 21A', and the photoelectric conversion film 21B).

In this case, the multiple photoelectric conversion films 21 included in the photoelectric conversion layer 20 are also arranged such that the density is increased from the one end side to the other end side in the thickness direction Z of the photoelectric conversion layer 20, in the same manner as described above. Specifically, the photoelectric conversion layer 20 is structured as a layered structure in which the photoelectric conversion film 21A, the photoelectric conversion film 21A', and the photoelectric conversion film 21B are layered in this order from the up side to the down side in the incident direction of the radiation L (the arrow Z1 direction). The amount of the additive material 20B added to the photoelectric conversion material 20A is adjusted such that the density is increased in a step by step manner from the photoelectric conversion film 21A to the photoelectric conversion film 21A', and to the photoelectric conversion film 21B in this order.

Likewise, as described above, the photoelectric conversion films 21A, 21A', and 21B have the same composition.

Photodetection Element 10E

FIGS. 2 to 5 each illustrate an example where the photoelectric conversion layer 20 is disposed between the electrodes 22A and 22B. Specifically, in each example, the photoelectric conversion layer 20 is disposed by being sandwiched by the electrodes 22A and 22B from both sides in the thickness direction Z.

At least one of the electrodes 22A and 22B may be disposed on a side surface of the photoelectric conversion layer 20. The side surface of the photoelectric conversion layer 20 is an edge of the photoelectric conversion layer 20 in the direction perpendicular to the thickness direction Z.

Figure 6:
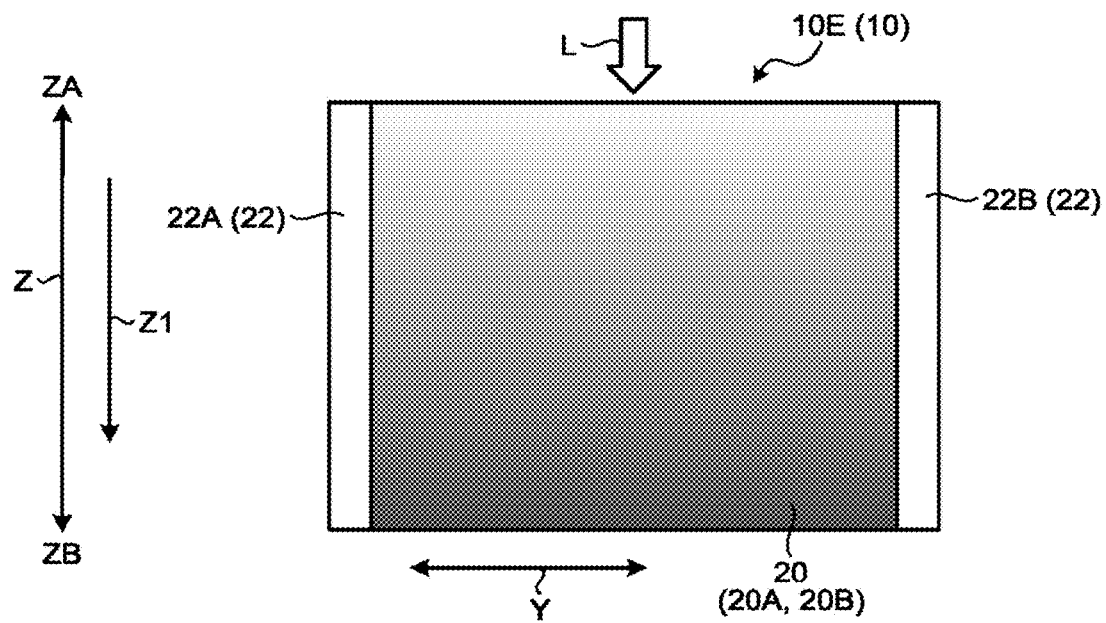
FIG. 6 is a schematic diagram of another photodetection element.

FIG. 6 is a schematic diagram illustrating an example of a photodetection element 10E. The photodetection element 10E is an example of the photodetection element 10.

As illustrated in FIG. 6, the photodetection element 10E may be structured in such a manner that the electrode 22 (the electrodes 22A and 22B) is disposed on both sides of the photoelectric conversion layer 20 in the direction (the arrow direction Y) perpendicular to the thickness direction Z of the photoelectric conversion layer 20.

When the electrodes 22A and 22B are arranged along the direction intersecting the thickness direction Z with the photoelectric conversion layer 20 interposed therebetween, adjustment is more easily done so as to increase the distance between the electrodes 22A and 22B than a case where they are arranged along the thickness direction Z with the photoelectric conversion layer 20 interposed therebetween. The structure illustrated in FIG. 6, thus, can suppress amplifier noise caused by electric capacitance between the electrodes 22A and 22B, for example.

The following describes the operation of the photodetection element 10.

The operation is described with reference to the photodetection element 10B illustrated in FIG. 3, as an example. The radiation L is incident on the photodetection element 10B structured as described above. The photoelectric conversion film 21A absorbs lower energy components in the radiation L. The photoelectric conversion film 21A is disposed on the up side in the incident direction of the radiation L (the arrow Z1 direction) and has a density lower than that of the photoelectric conversion film 21B.

The photoelectric conversion film 21B absorbs higher energy components in the radiation L. The photoelectric conversion film 21B is disposed on the down side in the incident direction of the radiation L (the arrow Z1 direction) and has a density higher than that of the photoelectric conversion film 21A. The radiation L more easily scatters backward in the photoelectric conversion film 21B, which has a density higher than that of the photoelectric conversion film 21A, compared to the photoelectric conversion film 21A. The components of the radiation L scattered backward in the photoelectric conversion film 21B are, however, absorbed again by the photoelectric conversion film 21A having a density lower than that of the photoelectric conversion film 21B. As a result, the backscattering of the radiation L can be reduced.

The photoelectric conversion layer 20 included in the photodetection element 10 in the embodiment, thus, can convert substantially all of the energy of the radiation L incident on the photoelectric conversion layer 20 into charges. As a result, the radiation detection element 10 in the embodiment can easily increase the detection accuracy of the radiation L.

Beta rays have a characteristic that beta rays lose less energy per unit length as the energy thereof is increased. The amount of energy that beta rays lose per unit length is proportionate to the density of a substance. The photoelectric conversion film 21B having a high density, thus, allows the photodetection element 10 to be capable of also detecting energy of, particularly, high energy beta rays.

In the embodiment, the photoelectric conversion layer 20 has a different density in the thickness direction Z, but has a uniform (the same) composition in the thickness direction Z. This structure causes an amount of carriers generated per unit energy to be substantially the same in each of the regions (specifically, each of the photoelectric conversion films 21A and 21B) having different densities in the photoelectric conversion layer 20.

As a result, a pair of electrodes 22 (the electrodes 22A and 22B) is arranged to the photoelectric conversion layer 20. This makes it unnecessary to additionally provide the electrode 22 for each of the regions having different densities in the photoelectric conversion layer 20. The photodetection element 10 in the embodiment, thus, can increase the detection accuracy of the radiation L with a simple structure.

Figure 7A:
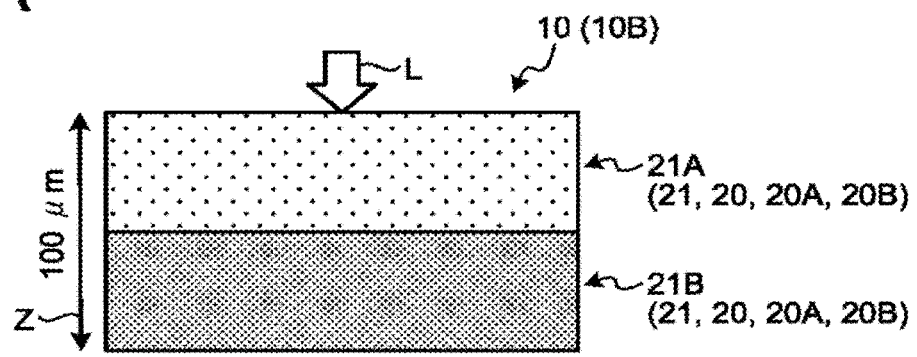
FIGS. 7A and 7B are explanatory views of a detection result.
Figure 7B:
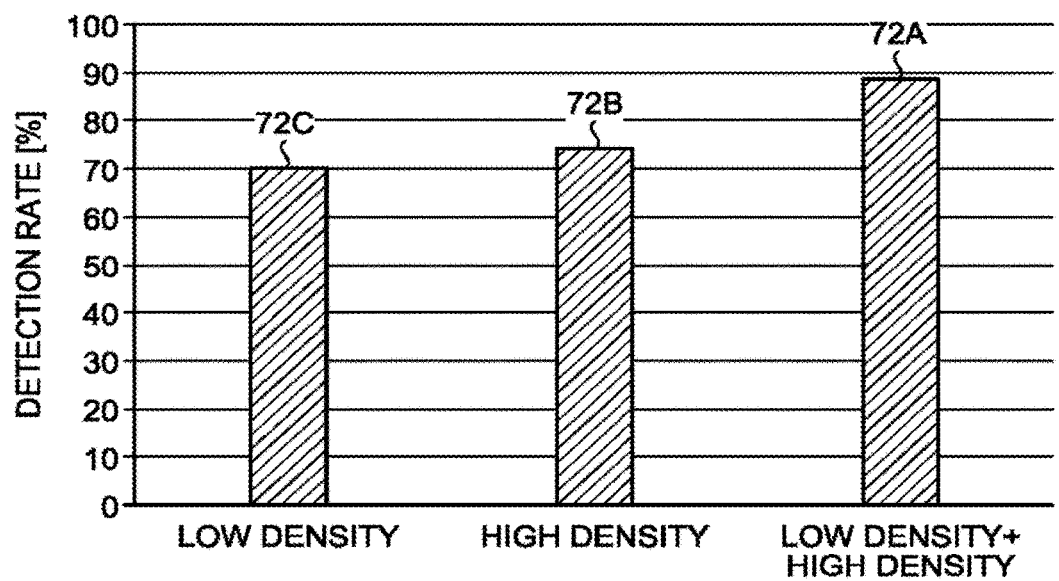

FIGS. 7A and 7B are schematic diagrams for explaining a result of detection rates by the photodetection element 10. The detection rates are obtained by Monte Carlo simulation.

In the simulation, the photodetection element 10 having the structure of the photodetection element 10B illustrated in FIG. 3 is used (refer to FIG. 7A). As for the photoelectric conversion film 21A, F8T2 is used for the photoelectric conversion material 20A while $Bi_2O_3$ is used for the additive material 20B. The mixing weight ratio of the photoelectric conversion material 20A to the additive material 20B is 1:1. As a result, the density of the photoelectric conversion film 21A is 2.3 $g/cm^3$. As for the photoelectric conversion film 21B, F8T2 is used for the photoelectric conversion material 20A and $Bi_2O_3$ is used for the additive material 20B. The mixing weight ratio of the photoelectric conversion material 20A to the additive material 20B is 1:10. As a result, the density of the photoelectric conversion film 21B is 5.8 $g/cm^3$.

The thickness of each of the photoelectric conversion films 21A and 21B is 50 µm. The thickness of the photoelectric conversion layer 20 is, thus, 100 µm, which is the sum of their thicknesses.

The photodetection element 10B is irradiated with beta rays, which is one type of the radiation L, with 318 keV. The irradiation direction is from the photoelectric conversion film 21A side toward the photoelectric conversion film 21B side.

A comparative photodetection element (hereinafter described as a comparative photodetection element C) is prepared in which only the photoelectric conversion film 21A (i.e., the photoelectric conversion film 21 having a low density) with a thickness of 100 µm is used as the photoelectric conversion layer 20 included in the photodetection element 10B illustrated in FIG. 7A instead of the photoelectric conversion layer 20 that is a layered structure composed of the photoelectric conversion films 21A and 21B. The comparative photodetection element C is irradiated with beta rays in the same manner as described above.

A comparative photodetection element (hereinafter described as a comparative photodetection element B) is prepared in which only the photoelectric conversion film 21B (i.e., the photoelectric conversion film 21 having a high density) with a thickness of 100 µm is used as the photoelectric conversion layer 20 included in the photodetection element 10B illustrated in FIG. 7A instead of the photoelectric conversion layer 20 that is a layered structure composed of the photoelectric conversion films 21A and 21B. The comparative photodetection element B is irradiated with beta rays in the same manner as described above.

FIG. 7B illustrates each detection rate of energy detected by each of the photodetection element 10, the comparative photodetection element B, and the comparative photodetection element B. The detection rate is a ratio of the detected energy to the energy of the incident radiation L.

In FIG. 7B, the bar labeled 72A represents the detection result by the photodetection element 10B. The bar labeled 72C represents the detection result by the comparative photodetection element C. The bar labeled 72B represents the detection result by the comparative photodetection element B.

As illustrated in FIG. 7B, the detection rate in a case where the photoelectric conversion layer 20 is a layered structure composed of the photoelectric conversion film 21A having a low density and the photoelectric conversion film 21B having a high density (refer to the bar labeled 72A) is increased by 10% or more than a case where the photoelectric conversion layer 20 is structured by only the photoelectric conversion film 21B having a high density (refer to the bar labeled 72B) and a case where the photoelectric conversion layer 20 is structured by only the photoelectric conversion film 21A having a low density (refer to the bar labeled 72C).

In the comparative photodetection element C using only the photoelectric conversion film 21A having a low density as the photoelectric conversion layer 20, some of the radiation L (in this case, beta rays) penetrate the photoelectric conversion film 21A. It is, thus, conceivable that the detection rate is reduced. In the comparative photodetection element B using only the photoelectric conversion film 21B having a high density as the photoelectric conversion layer 20, it is conceivable that the detection rate is reduced due to influence of backscattering.

In contrast, when the photoelectric conversion layer 20 is structured as a layered structure composed of the photoelectric conversion film 21A having a low density and the photoelectric conversion film 21B having a high density (refer to the bar labeled 72A), the radiation L after penetrating the photoelectric conversion film 21A is absorbed by the photoelectric conversion film 21B, and the components of the radiation L scattered backward from the photoelectric conversion film 21B are absorbed again by the photoelectric conversion film 21A. It is, thus, conceivable that the detection rate by the photodetection element 10B is more increased than those by the comparative photodetection elements B and C.

Figure 8:
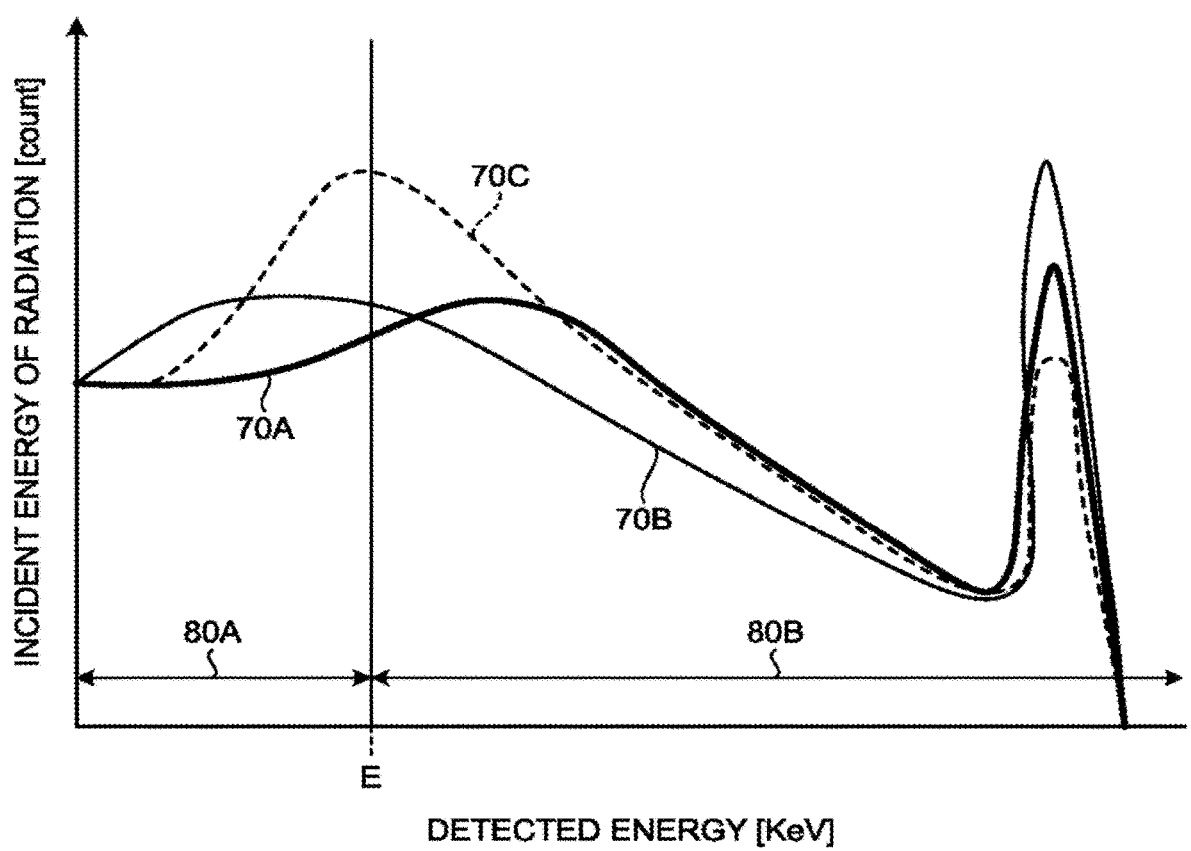
FIG. 8 is a schematic diagram illustrating a relation between incident energy and detected energy.

FIG. 8 is a schematic diagram illustrating a relation between incident energy (a count number) of radiation and detected energy for each of the photodetection element 10B, the comparative photodetection element B, and the comparative photodetection element C. The relations are obtained by Monte Carlo simulation.

In FIG. 8, a range 80A, in which the detected energy is equal to or smaller than a threshold "E", is a noise level region. In FIG. 8, a range 80B, in which the detected energy is equal to or larger than the threshold "E", is a region in which energy of the radiation L is detected as the detected energy.

In FIG. 8, the thick solid line 70A represents the detection result by the photodetection element 10B. The dashed line 70C represents the detection result by the comparative photodetection element C. The thin solid line 70B represents the detection result by the comparative photodetection element B.

As illustrated in FIG. 8, the value in the range 80A, which is the noise level region, is smaller in a case where the photoelectric conversion layer 20 is a layered structure composed of the photoelectric conversion film 21A having a low density and the photoelectric conversion film 21B having a high density (refer to the thick solid line 70A) than a case where the photoelectric conversion layer 20 is structured by only the photoelectric conversion film 21B having a high density (refer to the thin solid line 70B) and a case where the photoelectric conversion layer 20 is structured by only the photoelectric conversion film 21A having a low density (refer to the dashed line 70C). When the photoelectric conversion layer 20 is structured as a layered structure composed of the photoelectric conversion film 21A having a low density and the photoelectric conversion film 21B having a high density (refer to the thick solid line 70A), energy (practically, signals) buried in noise is reduced. It is, thus, conceivable that the detection rate is increased.

As described above, the photodetection element 10 in the embodiment includes the photoelectric conversion layer 20. The photoelectric conversion layer 20 converts energy of the radiation L into charges, and has a density increasing from the one end side ZA to the other end side ZB in the thickness direction Z and a uniform composition in the thickness direction Z.

As a result, the photodetection element 10 in the embodiment can easily increase the detection accuracy of the radiation L.

Photodetection Element 10F

The photoelectric conversion layer 20 included in the photodetection element 10 may be provided in a plurality of regions E.

Figure 9:
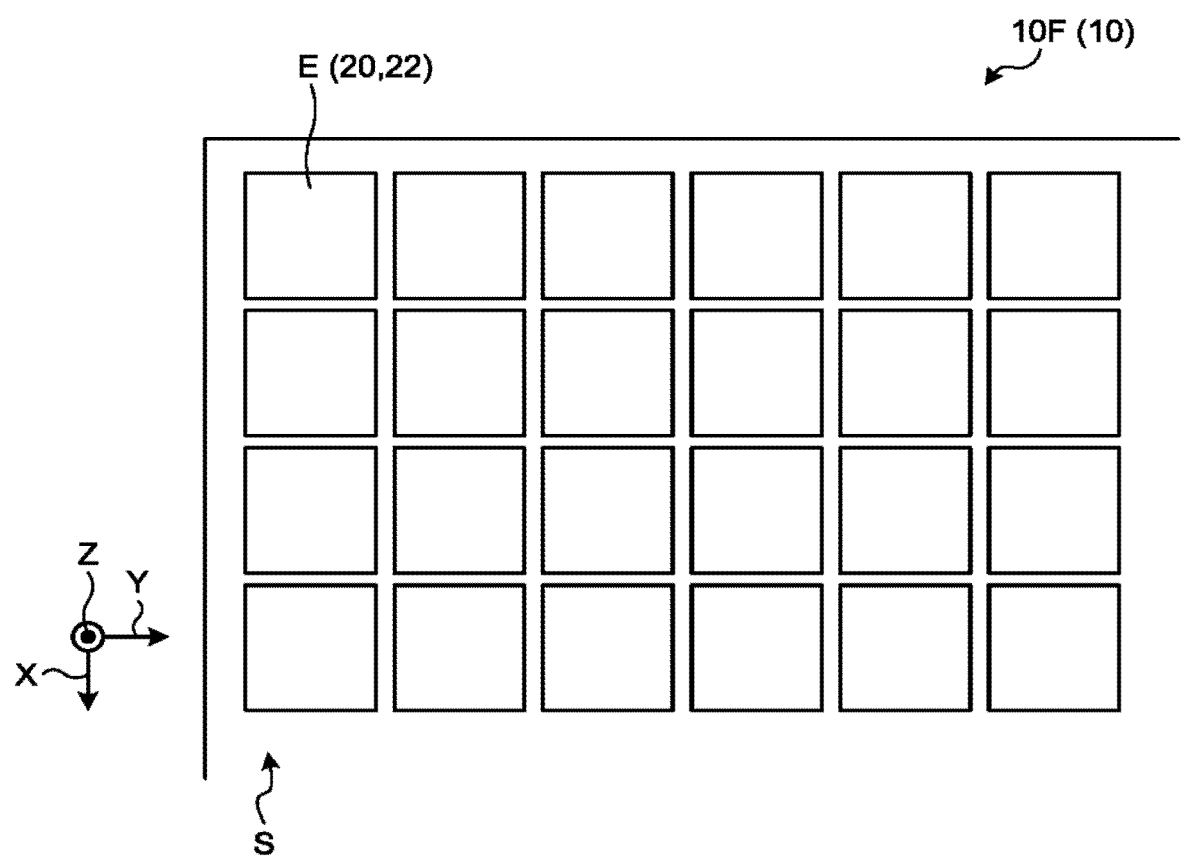
FIG. 9 is a schematic diagram of another photodetection element.

FIG. 9 is a schematic diagram illustrating an example of a photodetection element 10F. The photodetection element 10F is an example of the photodetection element 10.

The photodetection element 10F is a layered structure composed of the electrode 22B, the photoelectric conversion layer 20, and the electrode 22A, which are layered in this order, in the same manner as the photodetection element 10 each illustrated in FIGS. 2 to 5 (the photodetection elements 10A to 10D).

In the photodetection element 10F, the photoelectric conversion layer 20 is divided into the multiple regions E along a photon receiving surface S.

The photon receiving surface S of the photodetection element 10F is a plane perpendicular to the thickness direction Z of the photodetection element 10F. In other words, the photon receiving surface S is an XY plane that is perpendicular to the thickness direction Z of the photodetection element 10F, and formed in two directions (the X direction and the Y direction) perpendicular to each other.

The region E may be a pixel region corresponding to a single pixel. The region E may be a region corresponding to a plurality of pixels.

The photoelectric conversion layer 20 and the electrode 22 are preferably arranged for each region E. The photodetection element 10F, thus, preferably includes, for each region E, the layered structure composed of the electrode 22B, the photoelectric conversion layer 20, and the electrode 22A.

In this structure, the electrode 22 disposed for each region E can read the output signal from the corresponding region E. This structure allows the photodetection element 10F also to be used as a photodetection element that detects an incident position of the radiation L. This structure more reduces the electric capacitance between the regions E than a case where the photodetection element 10 is not composed of a plurality of regions E, thereby making it possible to reduce amplifier noise.

The photodetection element 10F, which includes the photoelectric conversion layer 20 having the same structure as described above, can also achieve the same effects as the photodetection elements 10A to 10E.

Photodetection Elements 10G and 10H

The structure of the photoelectric conversion layer 20 may be the same or differ from one another among the regions E. Specifically, the photoelectric conversion layer 20 included in the photodetection element 10 may include the regions E differing in at least one of the thickness, the constituent materials, and the density along the photon receiving surface S. The fact that the density differs along the photon receiving surface S means that the constituent ratio and the thickness ratio of the photoelectric conversion film 21A having a low density to the photoelectric conversion film 21B having a high density, and the constituent materials of the photoelectric conversion films 21A and 21B in the thickness direction Z differ parallel to the photon receiving surface S.

The fact that the photoelectric conversion layers 20 have the same structure means that the thickness, the constituent materials, and the density are the same with each other. The fact that the photoelectric conversion layers 20 have different structures means that at least one of the thickness, the constituent materials, and the density differs from each other.

The photoelectric conversion layer 20 disposed for each region E has a density increasing from the one end side ZA to the other end side ZB in the thickness direction Z and the same (a uniform) composition in the thickness direction Z, in the same manner as described above.

Figure 10:
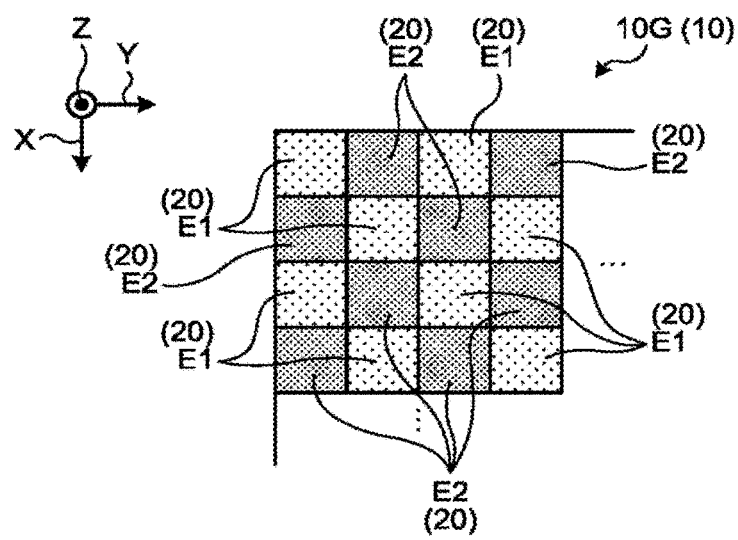
FIG. 10 is a schematic diagram of another photodetection element.
Figure 11:
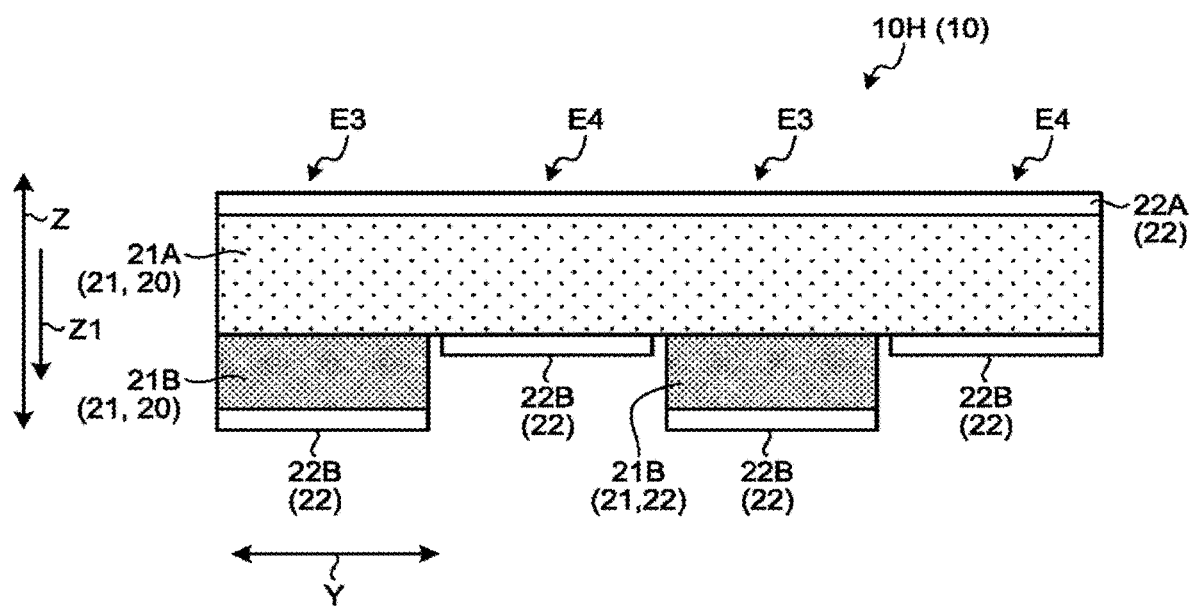
FIG. 11 is a schematic diagram of another photodetection element.

FIG. 10 illustrates a photodetection element 10G as an example of the photodetection element 10 while FIG. 11 illustrates a photodetection element 10H as an example of the photodetection element 10.

FIG. 10 is a schematic diagram illustrating an example of the photodetection element 10G. The photodetection element 10G includes the photoelectric conversion layers 20 composed of two types of structures. The photodetection element 10G is an example where regions E (regions E1 and regions E2) including the photoelectric conversion layers 20 having respective types of structures are arranged along the photon receiving surface S such that the respective regions E1 and E2 are alternately arranged.

FIG. 11 is a schematic diagram illustrating an example of the photodetection element 10H. The photodetection element 10H is an example where a plurality of types of regions E (regions E3 and regions E4) including the photoelectric conversion layers 20 differing in structure are arranged along the photon receiving surface S such that the respective regions E3 and E4 are alternately arranged. In the example illustrated in FIG. 11, the photoelectric conversion layer 20 included in the region E3 is structured as a layered structure composed of the photoelectric conversion film 21A and the photoelectric conversion film 21B. The photoelectric conversion layer 20 included in the region E4 is structured with the photoelectric conversion film 21A.

In this way, the photoelectric conversion layer 20 is provided in a plurality of regions E differing in at least one of the thickness, the constituent materials, and the density along the photon receiving surface S of the radiation L. This structure makes it possible to adjust, for each of regions E having different structures, at least one of the type of radiation L photoelectrically converted by the photoelectric conversion layer 20, intensity of the radiation L, and a target photoelectric conversion efficiency.

As a result, the photodetection element 10 can detect various types of the radiation L with a wide range of energy sensitivity as a whole.

As illustrated in FIGS. 9 to 11, the multiple regions E are arranged in a two-dimensional grid along the photon receiving surface S. This arrangement can reduce position dependency that causes the detection accuracy in the photodetection element 10 to vary at respective positions of the regions E.

The photodetection elements 10F, 10G, and 10H each include the photoelectric conversion layer 20, thereby making it possible to achieve the same effects as the photodetection elements 10A to 10E.

The photodetection elements 10 (the photodetection elements 10A to 10H) each preferably have flexibility and bending property. The materials used for and the thickness of each of the photodetection elements 10 are preferably adjusted so as to have flexibility and bending property in addition to the achievement of the conditions described above.

Signal Processor 12

Referring back to FIG. 1, the following describes the signal processor 12.

As described above, the signal processor 12 is electrically connected to the photodetection element 10, the storage 14, the communication unit 16, and the display 18.

The following describes an example where the photodetection element 10 is the photodetection element 10A (refer to FIG. 2). The signal processor 12 performs the same processing when the photodetection element 10 is any of the photodetection elements 10B to 10E.

The signal processor 12 performs signal processing on the output signal output from the photodetection element 10A. The signal processor 12 includes an acquirer 12A, an specifier 12B, and an output controller 12C. The acquirer 12A, the specifier 12B, and the output controller 12C are achieved by a single or a plurality of processors, for example. The respective units may be achieved by a processor such as a central processing unit (CPU) executing a computer program, that is, achieved by software. The respective units may be achieved by a processor such as a dedicated integrated circuit (IC), that is, achieved by hardware. The respective units may be achieved by combining software and hardware. When a plurality of processors are used, each processor may achieve one of the units or two or more units.

The acquirer 12A acquires the output signal from the photodetection element 10.

The output signal is a signal representing charges converted by the photoelectric conversion layer 20. In other words, the output signal is average detected energy of the radiation L, the energy being detected by the photoelectric conversion layer 20. The signal processor 12 converts an amount of charges detected by the photoelectric conversion layer 20 into a measurable signal by a charge amplifier, and further performs analog to digital (A/D) conversion on the signal to produce an output signal. In the embodiment, the signal processor 12 receives the output signal from the photoelectric conversion layer 20 for simplifying description.

The specifier 12B specifies the detected energy of the radiation L using the output signal acquired by the acquirer 12A and a conversion table 14A stored in the storage 14.

The conversion table 14A associates the output signal with the incident energy of the radiation L. For example, the incident energy of the radiation L incident on the photodetection element 10 and the output signal output from the photodetection element 10 are preliminarily measured using the photodetection element 10 used for detection (e.g., the photodetection element 10A). The signal processor 12 preliminarily stores the conversion table 14A indicating a relation between the output signal and the incident energy of the radiation L in the storage 14.

The signal processor 12 may preliminarily prepare the conversion table 14A by simulation. The signal processor 12 may preliminarily prepare the conversion table 14A using Monte Carlo simulation, for example, when the photodetector 1000 is started or calibration is performed. The conversion table 14A may be prepared by an external device, for example. The storage 14 may preliminarily store therein the conversion table 14A.

Any of a table, a function, a diagram, and a database can be used for the conversion table 14A as long as any of them indicates a relation between the incident energy of the radiation L incident on the photodetection element 10 and the output signal.

Referring back to FIG. 1, the description is continued. The signal processor 12 may preliminarily prepare the conversion table 14A for each type of the radiation L serving as the detection target, and store the conversion tables 14A in the storage 14.

For example, the signal processor 12 may preliminarily prepare the conversion tables 14A each corresponding to one of beta rays, gamma rays, and the heavy particles beams, and store the conversion tables 14A in the storage 14. In this case, the photodetection element 10 is irradiated individually with each type of the radiation L and a relation between the incident energy of the type of the radiation L and the output signal is preliminarily measured when the conversion tables 14A are prepared. In this way, the signal processor 12 may preliminarily prepare the conversion table 14A for each type of the radiation L, and store the conversion tables 14A in the storage 14.

The specifier 12B specifies the incident energy corresponding to the output signal acquired by the acquirer 12A in the conversion table 14A as the detected energy of the radiation L, the energy being detected by the photodetection element 10.

Using the conversion table 14A corresponding to the type of the radiation L serving as a specification (identification) target, the specifier 12B can specify the detected energy of the radiation L serving as the specification target, the energy being detected by the photodetection element 10A.

The specifier 12B may specify the detected energy of any type of the radiation L. The specifier 12B preferably specifies particularly the detected energy of beta rays. In this case, the specifier 12B specifies the detected energy of beta rays using the conversion table 14A corresponding to beta rays serving as one type of the radiation L.

The output controller 12C performs control such that the information indicating the result specified by the specifier 12B is output to the communication unit 16 and the display 18.

Figure 12:
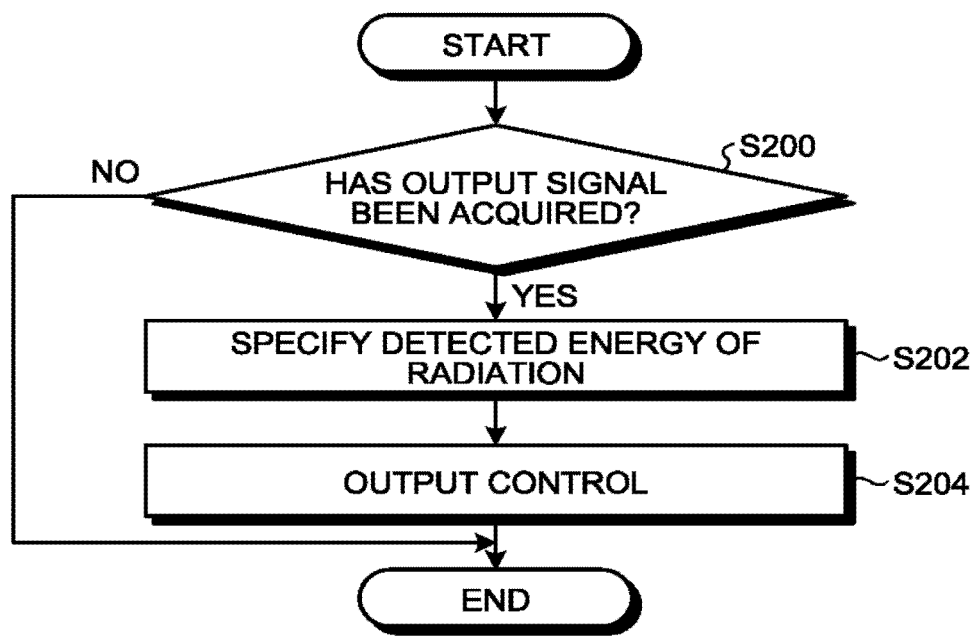
FIG. 12 is a flowchart illustrating a procedure of information processing.

The following describes an example of a procedure of information processing performed by the signal processor 12. FIG. 12 is a flowchart illustrating an exemplary procedure of the information processing performed by the signal processor 12. FIG. 12 illustrates an example where the photodetection element 10A is used as the photodetection element 10.

First, it is determined whether the acquirer 12A has acquired the output signal from the photoelectric conversion layer 20 included in the photodetection element 10A (step S200). If a negative determination is made at step S200 (No at step S200), this routine ends. If an affirmative determination is made at step S200 (Yes at step S200), the processing proceeds to step S202.

The specifier 12B specifies the detected energy of the radiation L using the output signal acquired at step S200 and the conversion table 14A (step S202).

The specifier 12B specifies the type of the radiation L serving as the detection target, for example. The type of the radiation L serving as the detection target may be received from the external device via the communication unit 16 or from an input unit that a user operates.

The specifier 12B reads the conversion table 14A corresponding to the specified type of the radiation L from the storage 14. The specifier 12B reads the conversion table 14A corresponding to beta rays from the storage 14, for example. The specifier 12B reads the incident energy of the radiation L corresponding to the output signal acquired at step S200 in the read conversion table 14A. The specifier 12B specifies the read incident energy as the detected energy of the radiation L (e.g., beta rays), the energy being detected by the photodetection element 10A.

The output controller 12C performs control such that the information indicating the result specified at step S202 is output to the communication unit 16 and the display 18 (step S204). By the processing at step S204, the information indicating the specification result is transmitted to the external device from the communication unit 16. By the processing at step S204, the information indicating the specification result is displayed on the display 18. Then, this routine ends.

Each of the photodetection elements 10F to 10H illustrated in FIGS. 9 to 11 are used as the photodetection elements 10 in some cases. The photodetection elements 10F to 10H each include the photoelectric conversion layer 20 provided in a plurality of regions E along the photon receiving surface S. In such cases, the signal processor 12 included in the photodetector 1000 acquires the output signal and specifies the detected energy for each of the same type of regions E.

As a result, the photodetector 1000 can identify the detected energy corresponding to the respective types of the radiation L corresponding to the respective types of regions E.

As described above, the photodetection element 10 in the embodiment includes the photoelectric conversion layer 20. The photoelectric conversion layer 20 converts energy of the radiation L into charges, and has a density increasing from the one end side ZA to the other end side ZB in the thickness direction Z and a uniform composition in the thickness direction Z.

As a result, the photodetection element 10 in the embodiment can easily increase the detection accuracy of the radiation L.

As described above, the type of the radiation L serving as a target detected by the photodetector 1000 is preferably beta rays.

Beta rays have a particularly high probability of occurrence of backscattering among the various types of the radiation L. The photoelectric conversion layer 20 in the embodiment can suppress the backscattering of beta rays and increase the detection rate because of its unique structure described above.

Hardware Structure

Figure 13:
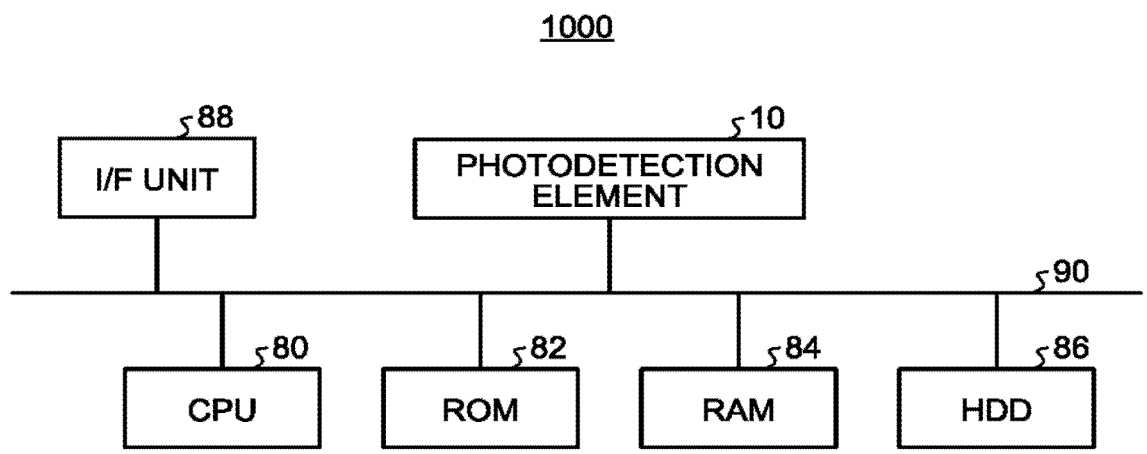
FIG. 13 is a block diagram of an exemplary hardware structure.

The following describes a hardware structure of the photodetector 1000 in the embodiment. FIG. 13 is a block diagram illustrating an example of the hardware structure of the photodetector 1000 in the embodiment.

The photodetector 1000 in the embodiment has a hardware structure using a typical computer. The hardware structure includes a central processing unit (CPU) 80, a read only memory (ROM) 82, a random access memory (RAM) 84, a hard disk drive (HDD) 86, an interface (I/F) unit 88, the photodetection element 10, and a bus 90 that connects the respective units to one another.

The CPU 80 is a computing unit that controls the processing of the whole of the photodetector 1000. The RAM 84 stores therein data necessary for various types of processing performed by the CPU 80. The ROM 82 stores therein a computer program that achieves the various types of processing performed by the CPU 80. The HDD 86 stores therein data stored in the storage 14. The I/F unit 88 is coupled to an external device or an external terminal via a communication line and serves as an interface to transmit data to and receive data from the coupled external device or external terminal.

A computer program to execute the processing performed by the photodetector 1000 in the embodiment is embedded and provided in the ROM 82, for example.

The computer program executed by the photodetector 1000 in the embodiment may be recorded and provided on a computer-readable recording medium such as a compact disc read only memory (CD-ROM), a flexible disk (FD), a compact disc recordable (CD-R), and a digital versatile disc (DVD), as an installable or executable file.

The computer program executed by the photodetector 1000 in the embodiment may be stored in a computer connected to a network such as the Internet, and may be provided by being downloaded via the network. The computer program executed by the photodetector 1000 in the embodiment may be provided or delivered via a network such as the Internet.

The computer program to achieve the various types of processing performed by the photodetector 1000 in the embodiment is configured to produce the respective units in a main storage device.

The various types of information stored in the HDD 86, that is, various types of information stored in the storage 14, may be stored in an external device (e.g., a server). In this case, the external device and the CPU 80 may be coupled via the I/F unit 88.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photodetection element, comprising:
   a photoelectric conversion layer having a density increasing from one end side to another end side in a thickness direction and a uniform composition in the thickness direction to convert energy of radiation into charges,
   wherein the photoelectric conversion layer contains a photoelectric conversion material that is an organic material and an additive material that is an inorganic material capable of supplying the energy of radiation to the photoelectric conversion material, and an amount of the additive material in the photoelectric conversion layer increases from the one end side to the other end side in the thickness direction.

2. The element according to claim 1, wherein the photoelectric conversion layer has a density increasing in a step by step manner or continuously from the one end side to the other end side in the thickness direction.

3. The element according to claim 1, wherein a part having a highest density in the photoelectric conversion layer is on a down side in an incident direction of radiation.

4. The element according to claim 1, wherein the photoelectric conversion layer is a layered structure including a plurality of photoelectric conversion films having different densities, and a ratio of the density of a photoelectric conversion film having a highest density to the density of a photoelectric conversion film having a lowest density among the photoelectric conversion films is equal to or larger than 1.1 and equal to or smaller than 5.

5. The element according to claim 1, wherein the additive material is a scintillation material.

6. The element according to claim 1, wherein the photoelectric conversion layer contains the additive material in varying amounts in the thickness direction.

7. The element according to claim 1, wherein the radiation is beta rays.

8. The element according to claim 1, wherein the photoelectric conversion layer has a plurality of regions differing in at least one of thickness, composition, and density parallel to a surface receiving the radiation.

9. The element according to claim 1, further comprising an electrode in contact with the photoelectric conversion layer.

10. A photodetector comprising the photodetection element according to claim 1.

11. The element according to claim 1, wherein the thickness direction of the photoelectric conversion layer coincides with an incident direction of the radiation to the photodetection element.

12. A photodetection element, comprising:
    a photoelectric conversion layer having a density increasing from one end side to another end side in a thickness direction and a uniform composition in the thickness direction to convert energy of radiation into charges,
    wherein the photoelectric conversion layer contains a photoelectric conversion material and an additive material that supplies the energy of radiation to the photoelectric conversion material, and
    the additive material is a scintillation material.

* * * * *